US010217869B2

(12) United States Patent
Cai et al.

(10) Patent No.: US 10,217,869 B2
(45) Date of Patent: Feb. 26, 2019

(54) SEMICONDUCTOR STRUCTURE INCLUDING LOW-K SPACER MATERIAL

(71) Applicants: International Business Machines Corporation, Armonk, NY (US); GLOBALFOUNDRIES INC., Grand Cayman (KY)

(72) Inventors: Xiuyu Cai, Niskayuna, NY (US); Kangguo Cheng, Schenectady, NY (US); Ali Khakifirooz, Los Altos, CA (US); Ruilong Xie, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/936,149

(22) Filed: Mar. 26, 2018

(65) Prior Publication Data

US 2018/0219096 A1 Aug. 2, 2018

Related U.S. Application Data

(60) Continuation of application No. 15/462,644, filed on Mar. 17, 2017, now Pat. No. 9,985,135, which is a (Continued)

(51) Int. Cl.

*H01L 29/66* (2006.01)
*H01L 29/51* (2006.01)

(Continued)

(52) U.S. Cl.

CPC ...... *H01L 29/7856* (2013.01); *H01L 21/0217* (2013.01); *H01L 21/28141* (2013.01);

(Continued)

(58) Field of Classification Search

CPC ........... H01L 29/66545; H01L 29/6656; H01L 29/518; H01L 29/6653

See application file for complete search history.

(56) References Cited

U.S. PATENT DOCUMENTS

| | | | |
|---|---|---|---|
| 7,838,373 | B2 | 11/2010 | Giles et al. |
| 8,222,100 | B2 | 7/2012 | Cheng et al. |

(Continued)

OTHER PUBLICATIONS

List of IBM Patents or Patent Applications Treated as Related.

(Continued)

*Primary Examiner* — Christine Enad
(74) *Attorney, Agent, or Firm* — Sherman IP LLP; Kenneth L. Sherman; Hemavathy Perumal

(57) ABSTRACT

A semiconductor structure includes a substrate, and a replacement metal gate (RMG) structure is attached to the substrate. The RMG structure includes a lower portion and an upper tapered portion. A source junction is disposed on the substrate and attached to a first low-k spacer portion. A drain junction is disposed on the substrate and attached to a second low-k spacer portion. A first oxide layer is disposed on the source junction, and attached to the first low-k spacer portion. A second oxide layer is disposed on the drain junction, and attached to the second low-k spacer portion. A cap layer is disposed on a top surface layer of the RMG structure and attached to the first oxide layer and the second oxide layer.

7 Claims, 16 Drawing Sheets

510
810
410
910
411
520
310
S
D
320
Sub
100

Related U.S. Application Data division of application No. 14/952,549, filed on Nov. 25, 2015, now Pat. No. 9,660,050.

(51) Int. Cl.

| | |
|---|---|
| ***H01L 29/78*** | (2006.01) |
| ***H01L 21/02*** | (2006.01) |
| ***H01L 21/321*** | (2006.01) |
| ***H01L 29/423*** | (2006.01) |
| ***H01L 21/28*** | (2006.01) |
| *H01L 29/786* | (2006.01) |

(52) U.S. Cl.

CPC .... *H01L 21/3212* (2013.01); *H01L 29/42364* (2013.01); *H01L 29/6653* (2013.01); *H01L 29/6656* (2013.01); *H01L 29/66545* (2013.01); *H01L 29/66575* (2013.01); *H01L 29/785* (2013.01); *H01L 29/78654* (2013.01)

(56) References Cited

U.S. PATENT DOCUMENTS

| | | | | |
|---|---|---|---|---|
| 8,519,454 | B2 | 8/2013 | Guo et al. | |
| 8,835,244 | B2 | 9/2014 | Xie et al. | |
| 8,878,300 | B1 | 11/2014 | Liu et al. | |
| 8,946,793 | B2 | 2/2015 | Xie et al. | |
| 9,048,254 | B2 * | 6/2015 | Chen | H01L 29/495 |
| 9,093,467 | B1 * | 7/2015 | Xie | H01L 29/66545 |
| 9,117,805 | B2 | 8/2015 | Niebojewski et al. | |
| 9,634,115 | B2 | 4/2017 | Xie et al. | |
| 9,660,050 | B1 * | 5/2017 | Cai | H01L 29/66545 |
| 9,985,135 | B2 * | 5/2018 | Cai | H01L 29/7856 |
| 2004/0135212 | A1 | 7/2004 | Dokumaci et al. | |
| 2009/0001480 | A1 | 1/2009 | Cheng | |
| 2011/0127589 | A1 * | 6/2011 | Chen | H01L 29/495 257/288 |
| 2011/0156107 | A1 | 6/2011 | Bohr et al. | |
| 2013/0049142 | A1 | 2/2013 | Liu et al. | |
| 2013/0277686 | A1 | 10/2013 | Liu et al. | |
| 2014/0042502 | A1 | 2/2014 | Xie et al. | |
| 2014/0110798 | A1 | 4/2014 | Cai et al. | |
| 2014/0138779 | A1 | 5/2014 | Xie et al. | |
| 2014/0295637 | A1 * | 10/2014 | Mehta | H01L 29/6653 438/300 |
| 2014/0353734 | A1 | 12/2014 | Xie et al. | |
| 2015/0111373 | A1 | 4/2015 | Cote et al. | |
| 2015/0214330 | A1 | 7/2015 | Wan et al. | |
| 2015/0243760 | A1 | 8/2015 | He et al. | |
| 2015/0249036 | A1 | 9/2015 | Cai et al. | |

OTHER PUBLICATIONS

Yamashita, T., et al., "A novel ALD SiBCN Low-k Spacer for Parasitic Capacitance Reduction in FinFETs", In IEEE on Symposium on VLSI Technology Digest of Technical Papers, Jun. 2015, pp. T154-T155, IEEE, Kyoto, Japan.

Anonymous, "Method and System for Fabricating a Partial and a Full Replacement Spacer for Replacement Metal Gate Devices", IPCOM000235793D, Mar. 25, 2014, pp. 1-5, IP.com, United States.

List of IBM Patents or Patent Applications Treated As Related; Cai, X. et al., filed Jan. 8, 2019, U.S. Appl. No. 16/242,834.

* cited by examiner

SEMICONDUCTOR STRUCTURE INCLUDING LOW-K SPACER MATERIAL

BACKGROUND

Fin field effect transistors (FinFETs) typically include a source region and a drain region interconnected by fins which serve as a channel region of the device and a gate that surrounds at least a portion of each of the fins between the source region and the drain region. Epitaxial deposition is typically used to form the source region and the drain region. As transistors continue to be reduced in size and have an increased number of transistors per unit of microchip, a metal-oxide semiconductor (MOS) FET (MOSFET) pitch of the transistors scales down (e.g., under 100 nm) and a thickness of a silicon nitride spacer of a gate structure also scales to provide a large enough contact area for a source/drain. A thinner spacer induces higher parasitic capacitance that can reduce processing speed. The parasitic capacitance may cause slower ring oscillator (RO) speed and eventually lower circuit working frequency. With higher effective capacitance ($C_{EFF}$) of RO, circuit performance may degrade and there may be higher power consumption during dynamic operation. In order to reduce $C_{EFF}$, low-k dielectrics, i.e., materials with a dielectric constant lower than silicon nitride, may be used to form the gate spacer. Typical low-k materials include SiBN, SiCN and SiBCN. Two integration processes can be used to integrate low-k dielectrics as a gate spacer. In a low-k spacer-first approach, after gate deposition and etch, a low-k dielectric is conformally deposited and then etched using an anisotropic etch process such as reactive ion etching (RIE). An issue with a low-k spacer first results in Carbon/Boron loss during spacer reactive ion etch (RIE) and epitaxial deposition, which can increase the value of K. Alternatively, a low-k spacer-last process can be used, where a sacrificial spacer, such as silicon nitride, is first formed, and is subsequently removed after all high temperature processes (typically >600° C.) in the integration flow are executed. The gap formed as a result of sacrificial spacer removal is then filled with a low-K dielectric. An issue with a low-k spacer-last is that the aspect ratio (a structure's height relative to its width) of the sacrificial spacer is too high, and it is not easy to etch down the sacrificial spacer without damaging the oxide inter-layer dielectric (ILD) and dummy polysilicon gate.

SUMMARY

One or more embodiments relate to field effect transistors including low-k spacers for low capacitance. One embodiment is a semiconductor structure that includes a substrate. A replacement metal gate (RMG) structure is attached to the substrate. The RMG structure includes a lower portion and an upper tapered portion. A source junction is disposed on the substrate and attached to a first low-k spacer portion. A drain junction is disposed on the substrate and attached to a second low-k spacer portion. A first oxide layer is disposed on the source junction, and attached to the first low-k spacer portion. A second oxide layer is disposed on the drain junction, and attached to the second low-k spacer portion. A cap layer is disposed on a top surface layer of the RMG structure and attached to the first oxide layer and the second oxide layer.

These and other features, aspects and advantages of the embodiments will become understood with reference to the following description, appended claims and accompanying figures.

DETAILED DESCRIPTION

The descriptions of the various embodiments of the embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

As used herein, a "lengthwise" element is an element that extends along a corresponding lengthwise direction, and a "widthwise" element is an element that extends along a corresponding widthwise direction.

Figure 1:
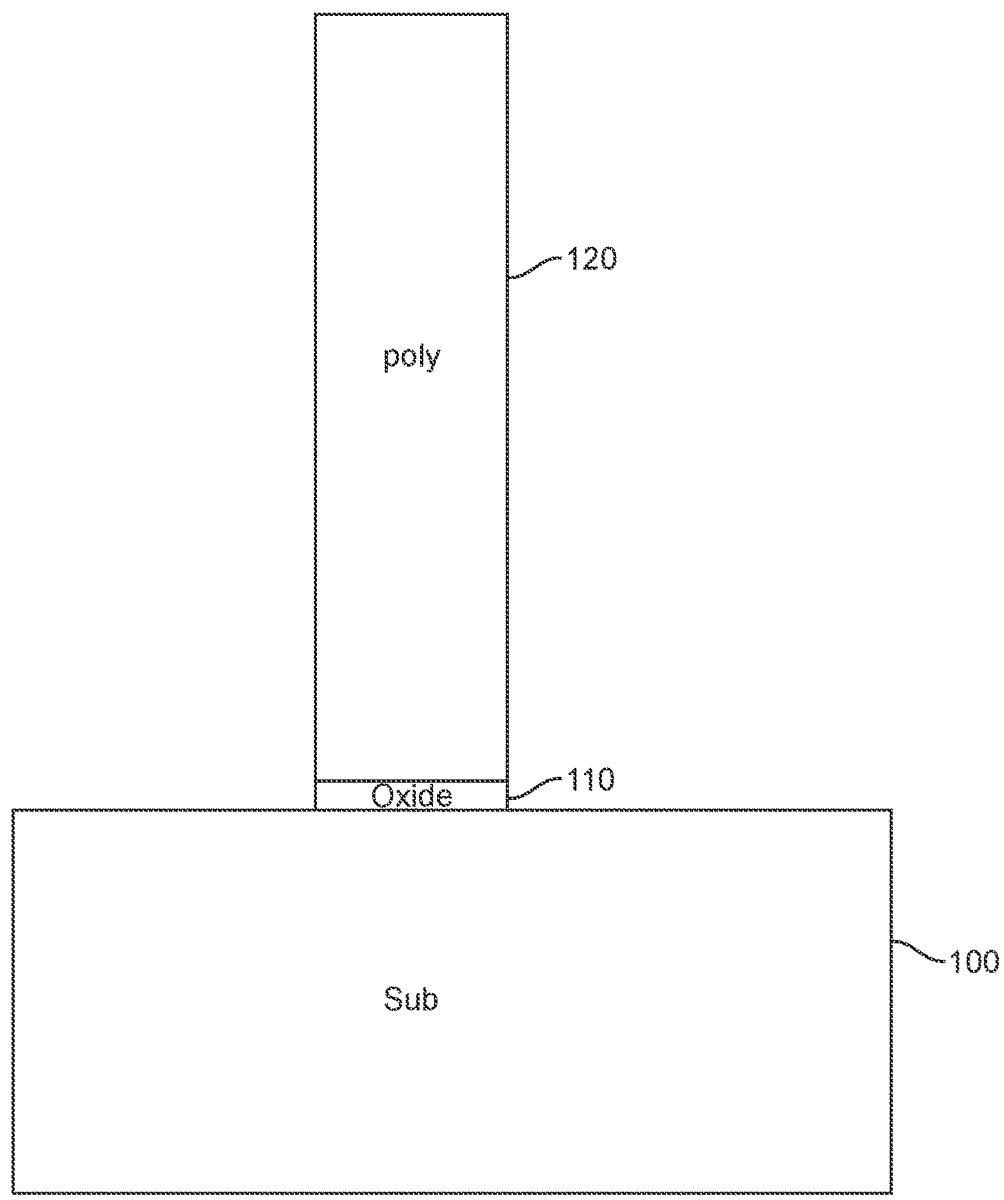
FIG. 1 is a cross-sectional view of an exemplary structure after formation of a deposited and patterned dummy gate stack on a substrate according to an embodiment.

FIG. 1 is a cross-sectional view of an exemplary structure after formation of a deposited and patterned dummy gate stack on a substrate 100 according to an embodiment. In one example, the dummy gate stack includes at least a vertical stack of an insulator layer 110 and a semiconductor material layer 120 (e.g., amorphous Si layer, poly-Si layer, etc., as an electrode). In one embodiment, the substrate 100 may be a semiconductor-on-insulator (SOI) substrate (e.g., fully-depleted SOI, partially depleted SOI, etc.). In other embodiments, the substrate 100 may be a bulk Fin field effect transistor (FinFET), SOI FinFET, Nanowire, etc. In one embodiment, the dummy stack may be formed using conventional techniques, such as isolation, deposition and patterning processes. In one embodiment, the insulator layer 110 may include exemplary dielectric materials, for example include, silicon oxide, silicon nitride, and silicon oxynitride. The thickness of the insulator layer 110 can be from 1 nm to 5 nm, although lesser and greater thicknesses can also be employed.

Figure 2:
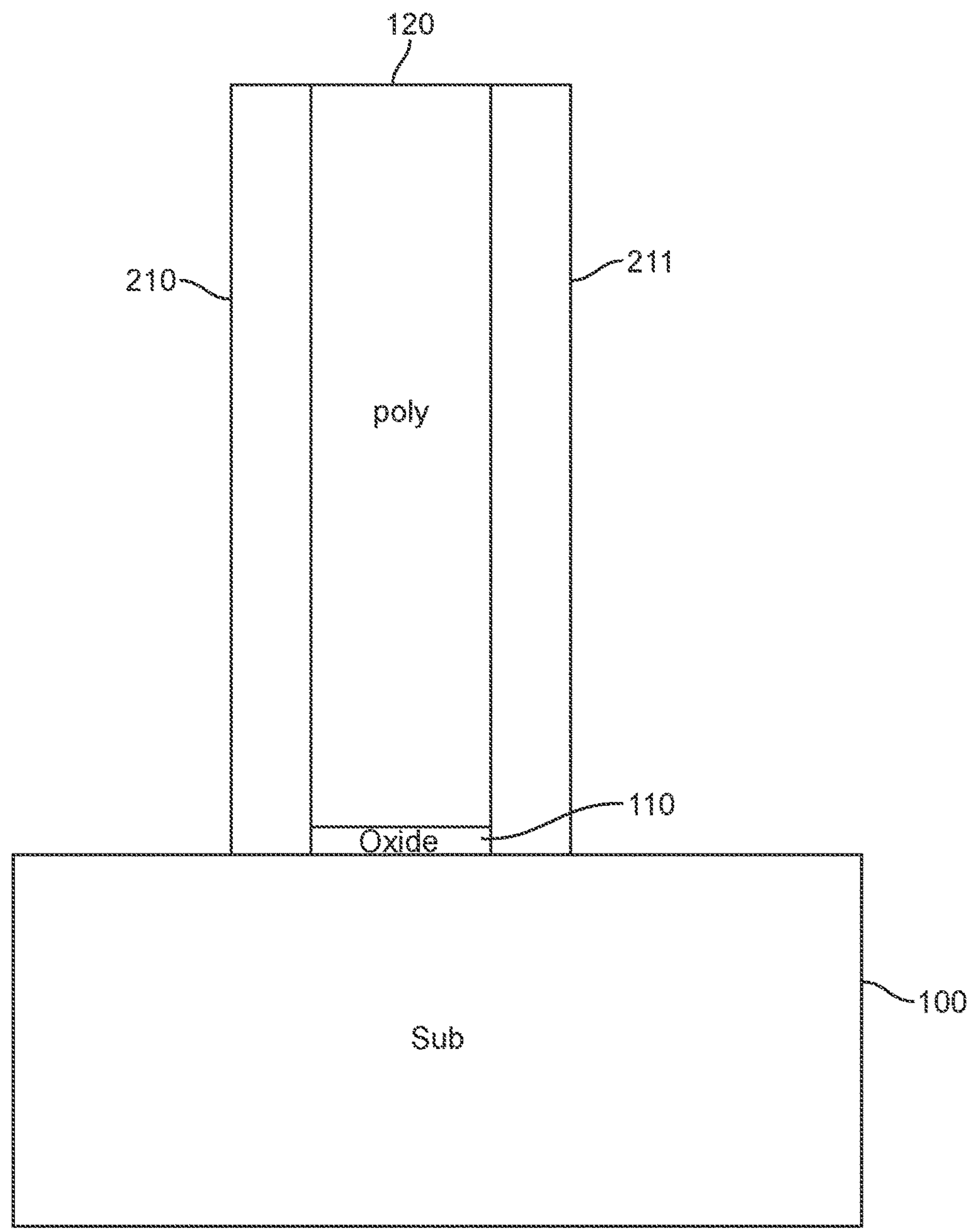
FIG. 2 is a cross-sectional view of the exemplary structure after formation of sacrificial spacers, according to an embodiment.

FIG. 2 is a cross-sectional view of the exemplary structure after formation of sacrificial spacers including at least a first sacrificial spacer portion 210 and a second sacrificial spacer portion 211, according to an embodiment. In one embodiment, the sacrificial spacers are formed by conformal deposition of a dielectric material layer (e.g., silicon nitride) and performing an anisotropic etch process that removes horizontal portions of the dielectric material layer. In one embodiment, the sacrificial spacers may have a thickness in a range from 5 nm to 20 nm, although lesser and greater thicknesses may also be employed.

Figure 3:
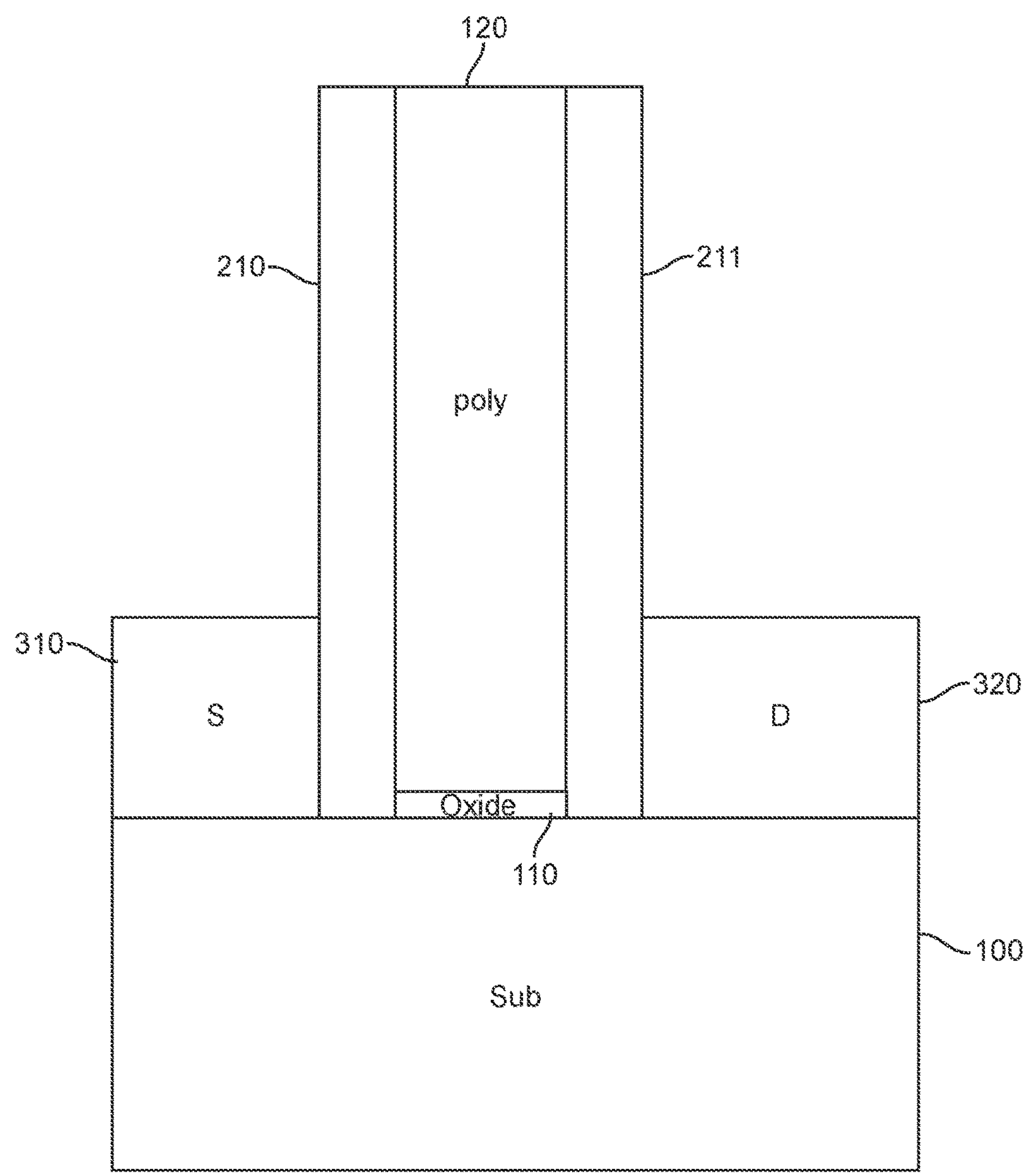
FIG. 3 is a cross-sectional view of the exemplary structure after formation of source and drain junctions, according to an embodiment.

FIG. 3 is a cross-sectional view of the exemplary structure after formation of source junction 310 and a drain junction 320, according to an embodiment. In one embodiment, an ion implant, growth of epitaxial layers, etc., may be employed to form the source junction 310 and the drain junction 320. In one example, the source junction and the drain junction are raised source/drain junctions (as shown in FIG. 3).

Figure 4:
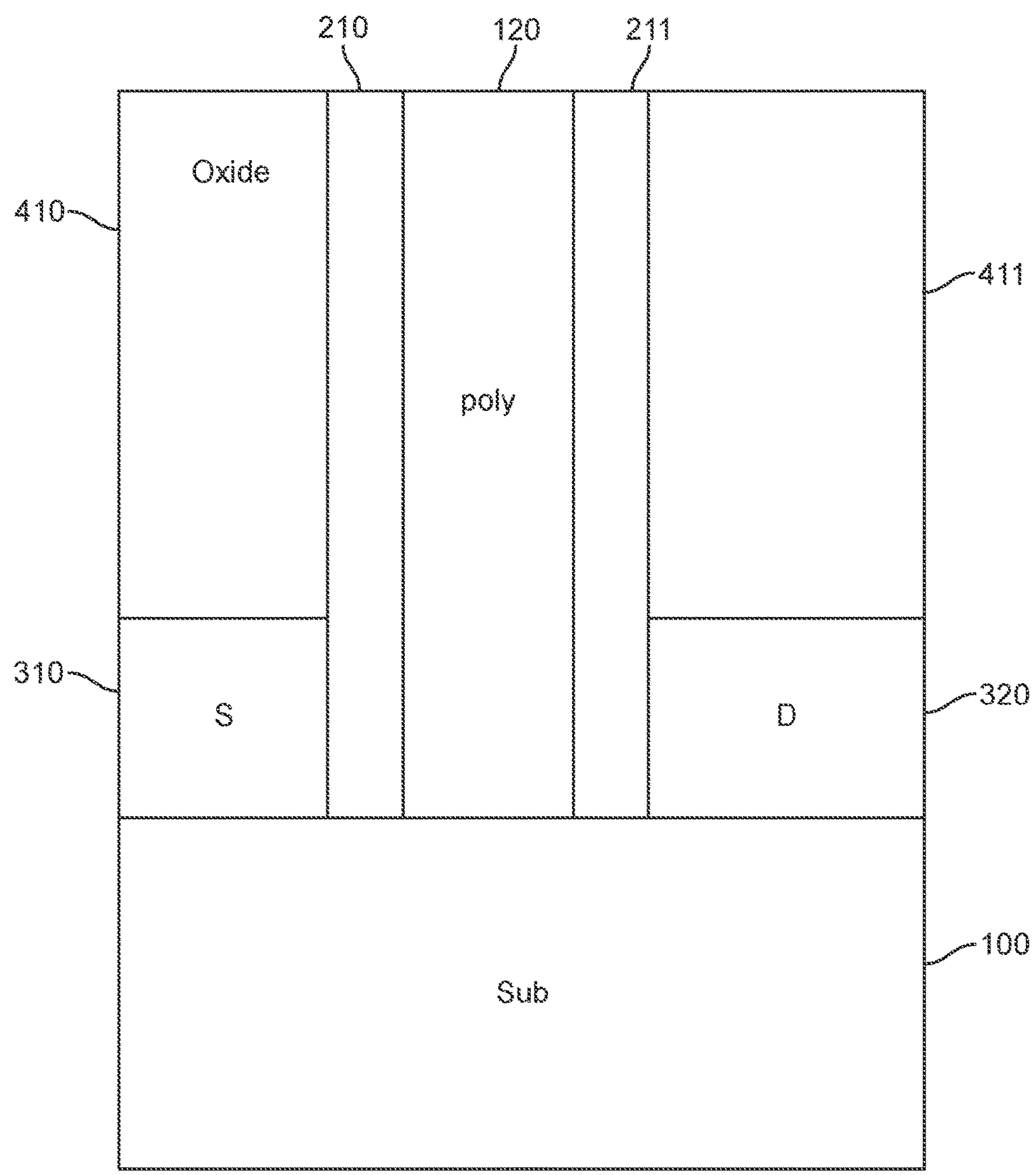
FIG. 4 is a cross-sectional view of the exemplary structure after depositing and chemical mechanical planarization (CMP) of inter-layer dielectric (ILD) oxide, according to an embodiment.

FIG. 4 is a cross-sectional view of the exemplary structure after depositing and chemical mechanical planarization (CMP) of inter layer dielectric (ILD) oxide layer portions 410 and 411, according to an embodiment. In one embodiment, the CMP stops on the semiconductor material layer 120. In some embodiments, the semiconductor material layer 120 (gate electrode) may have a cap layer (e.g., nitride) on top (e.g., on top of poly-silicon). In one example, CMP may be used to polish ILD layer portions 410 and 411 to be substantially flat with the top of the nitride cap. When an etch process is used to remove the nitride cap, an additional optional CMP may be used to make ILD oxide layer portions 410 and 411 flat with the top of the semiconductor material layer 120 (e.g., poly-silicon). The resulting structure at this point is the same whether or not a nitride cap is used in the process flow.

Figure 5:
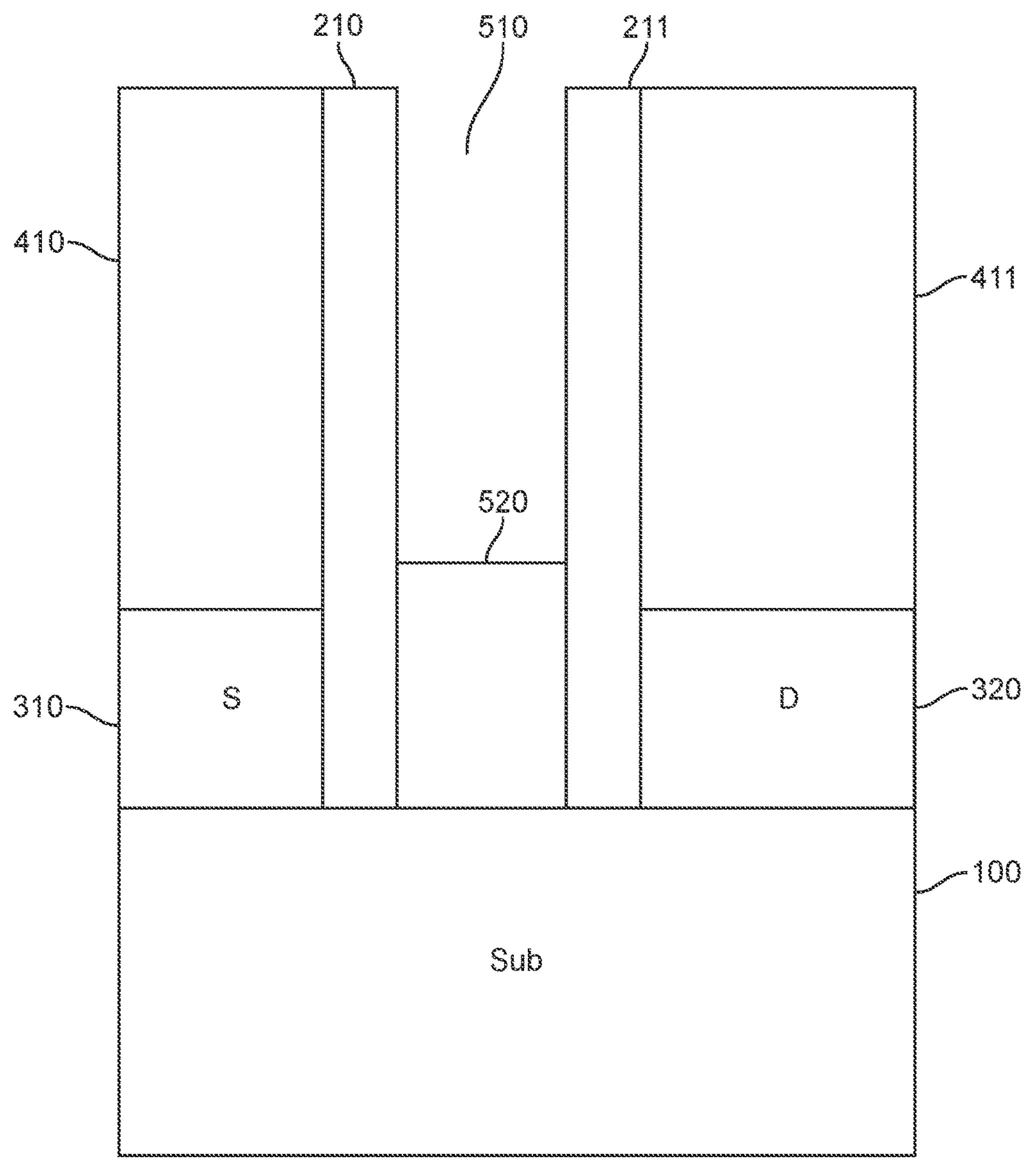
FIG. 5 is a cross-sectional view of the exemplary structure after performing a dummy gate stack poly partial recess process, according to an embodiment.

FIG. 5 is a cross-sectional view of the exemplary structure after performing a dummy gate stack poly partial recess process, according to an embodiment. In one embodiment, the poly partial recess process forms a partial recess 510 by removal of a portion of the semiconductor material layer 120 of the dummy gate stack leaving the remaining portion 520 of the semiconductor material layer 120.

Figure 6:
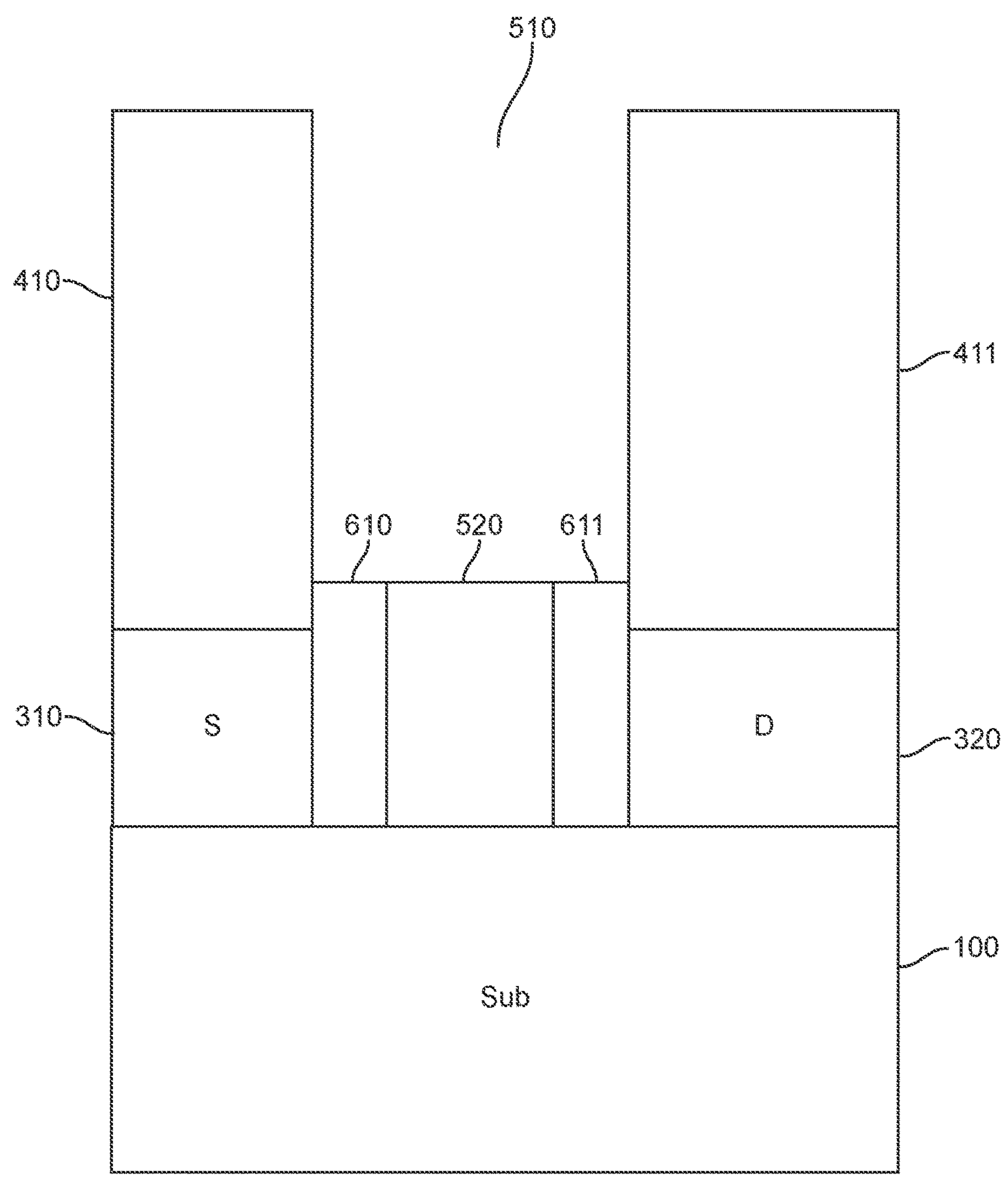
FIG. 6. is a cross-sectional view of the exemplary structure after performing etching on the sacrificial spacers, according to an embodiment.

FIG. 6 is a cross-sectional view of the exemplary structure after performing etching on the first sacrificial spacer portion 210 and the second sacrificial spacer portion 211, according to an embodiment. In one embodiment, the etching of the first sacrificial spacer portion 210 and the second sacrificial spacer portion 211 removes the sacrificial spacer material down to the remaining portion 520 of the dummy gate stack. In one example, the remaining sacrificial spacer portions 610 and 611 have a height at or near the height of the remaining portion 520.

Figure 7:
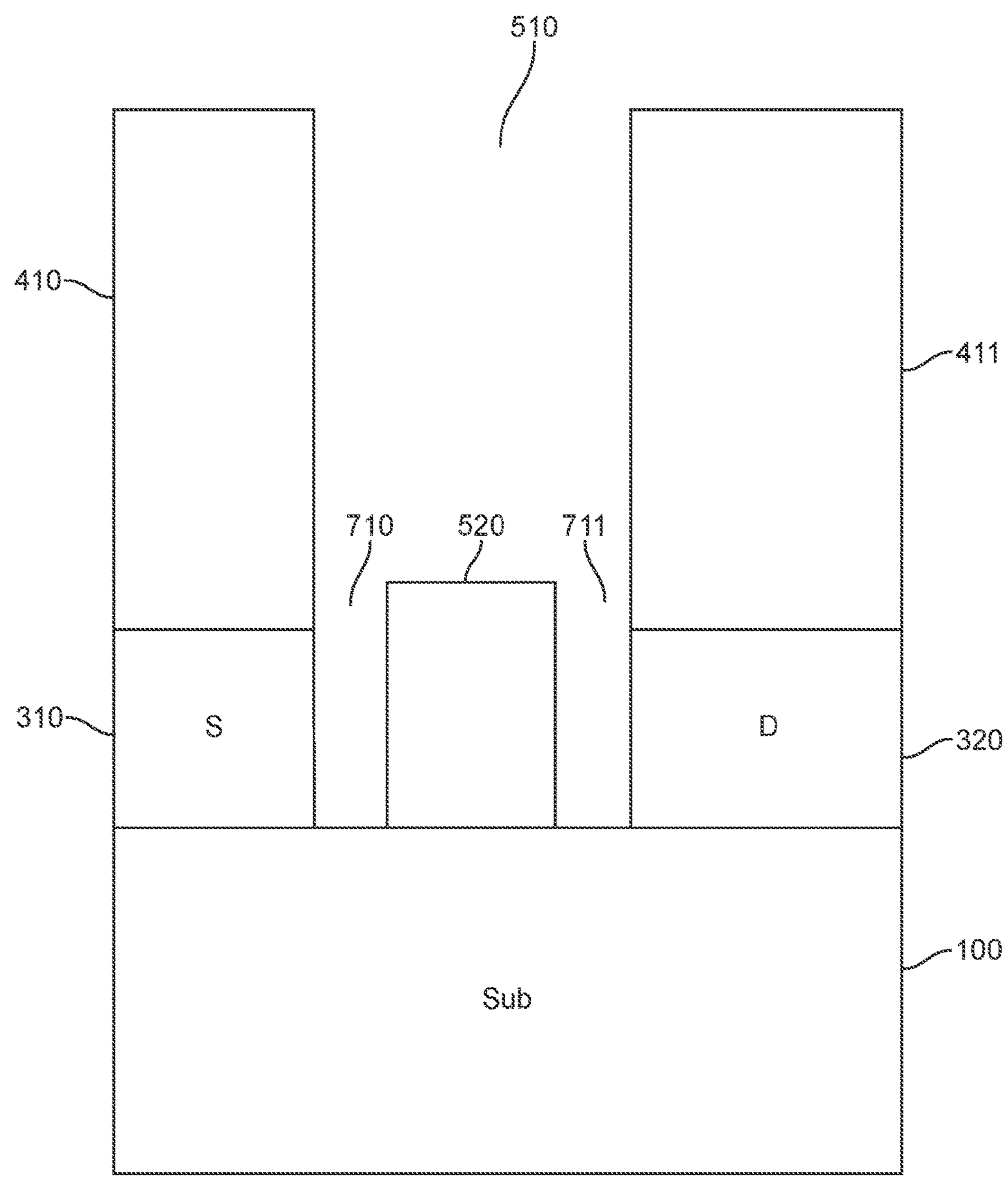
FIG. 7 is a cross-sectional view of the exemplary structure after performing an over etch removing the sacrificial spacers, according to an embodiment.

FIG. 7 is a cross-sectional view of the exemplary structure after performing an over etch removing the sacrificial spacer remaining portions 610 and 611, according to an embodiment. In one embodiment, recesses (or gaps) 710 and 711 are formed after the over etch. In one example, the recess of the semiconductor layer 120 and the etching of the first sacrificial spacer portion 210 and a second sacrificial spacer portion 211, and then over etch of the sacrificial spacer remaining portions 610 and 611 are easy to perform as the aspect ratio was reduced. The aspect ratio refers to a structure's height relative to its width. Structures on the substrate 100 can be characterized by an aspect ratio. Defined spaces, such as trenches, holes, vias, etc., can also be defined by an aspect ratio. As can be seen, the over etch leaves the gaps around and above the remaining portion 520.

Figure 8:
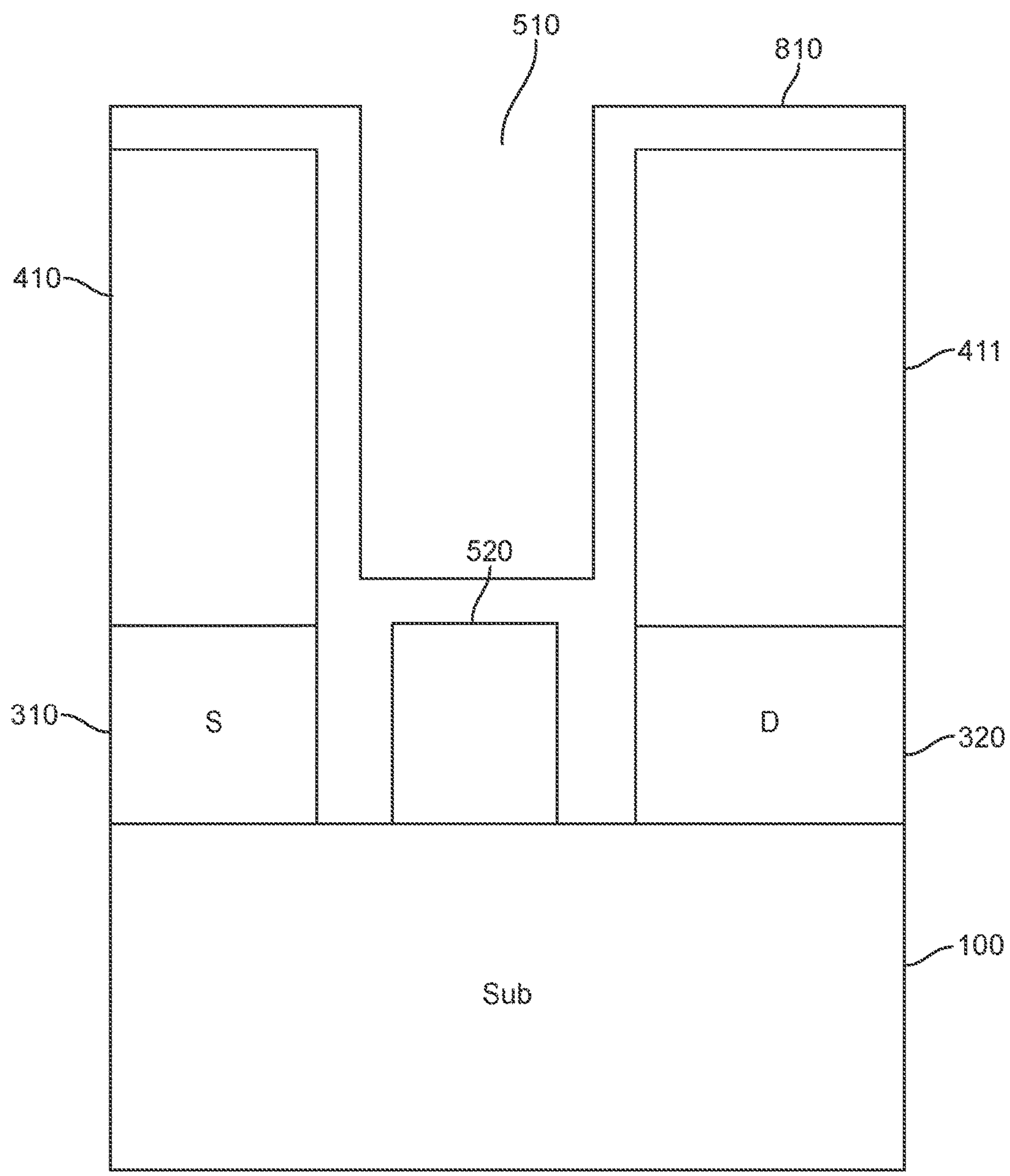
FIG. 8 is a cross-sectional view of the exemplary structure after formation low-k spacer deposition, according to an embodiment.

FIG. 8 is a top-down view of the exemplary structure after formation low-k spacer deposition, according to an embodiment. In one embodiment, a low-k spacer material 810 is deposited through any suitable techniques such as chemical vapor deposition (CVD), atomic layer deposition (ALD), and spin-on coating into the recesses 710 and 711, over the remaining portion 520, and on the top of and inter portions of the oxide layers 410 and 411. Thus, a low-k spacer(s) are formed to fill gaps around the remaining portion 520 and extending vertically along the sidewall of the gate cavity. In one embodiment, a low-k spacer is a spacer having a dielectric constant less than the dielectric constant of silicon nitride at room temperature, e.g., 7.0 or less, and preferably about, e.g., 5.0. Some examples of low-k materials may include, but are not limited to, silicon boron nitride (SiBN), silicon carbon nitride (SiCN), silicon boron carbon nitride (SiBCN), hydrogen silsesquioxane polymer (HSQ), methyl silsesquioxane polymer (MSQ), polyphenylene oligomer, methyl doped silica or Si0x(CH3)y, SiCxOyHy or SiOCH, organosilicate glass (SiCOH) and porous SiCOH, silicon oxide, boron nitride, silicon oxynitride, etc.

Figure 9:
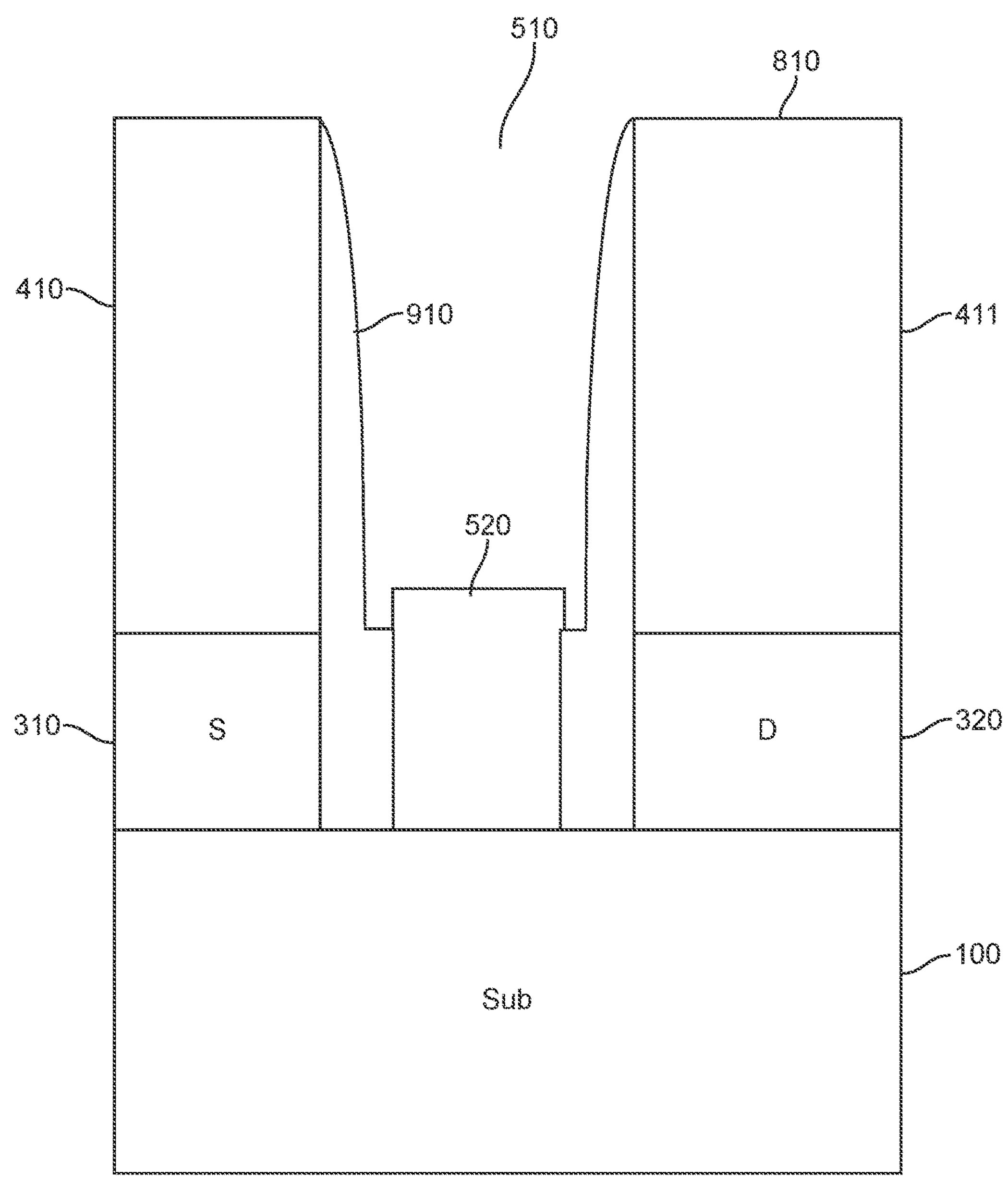
FIG. 9 is a cross-sectional view of the exemplary structure after low-k spacer etching, according to an embodiment of the present disclosure.

FIG. 9 is a cross-sectional view of the exemplary structure after low-k spacer etching, according to an embodiment of the present disclosure. In one embodiment, the low-k spacer material 810 is etched on the side walls and down below the remaining portion 520 to create a profile for the remaining low-k material 910, which is also removed from the top of the oxide layers 410 and 411. In one embodiment, the profile that is created from the low-k spacer material etch is in such a way that the cavity 510 formed between the remaining low-k material 910 is wider at its top than its bottom and is ideal for work function metal (WFM) fill and multiple depositions that are performed later for creation of the RMG structure. In one embodiment, the remaining low-k material 910 includes a first low-k spacer portion that has a constant width from a top portion to a bottom portion, and a second low-k spacer portion that has a width that tapers from a bottom portion to a top portion.

Figure 10:
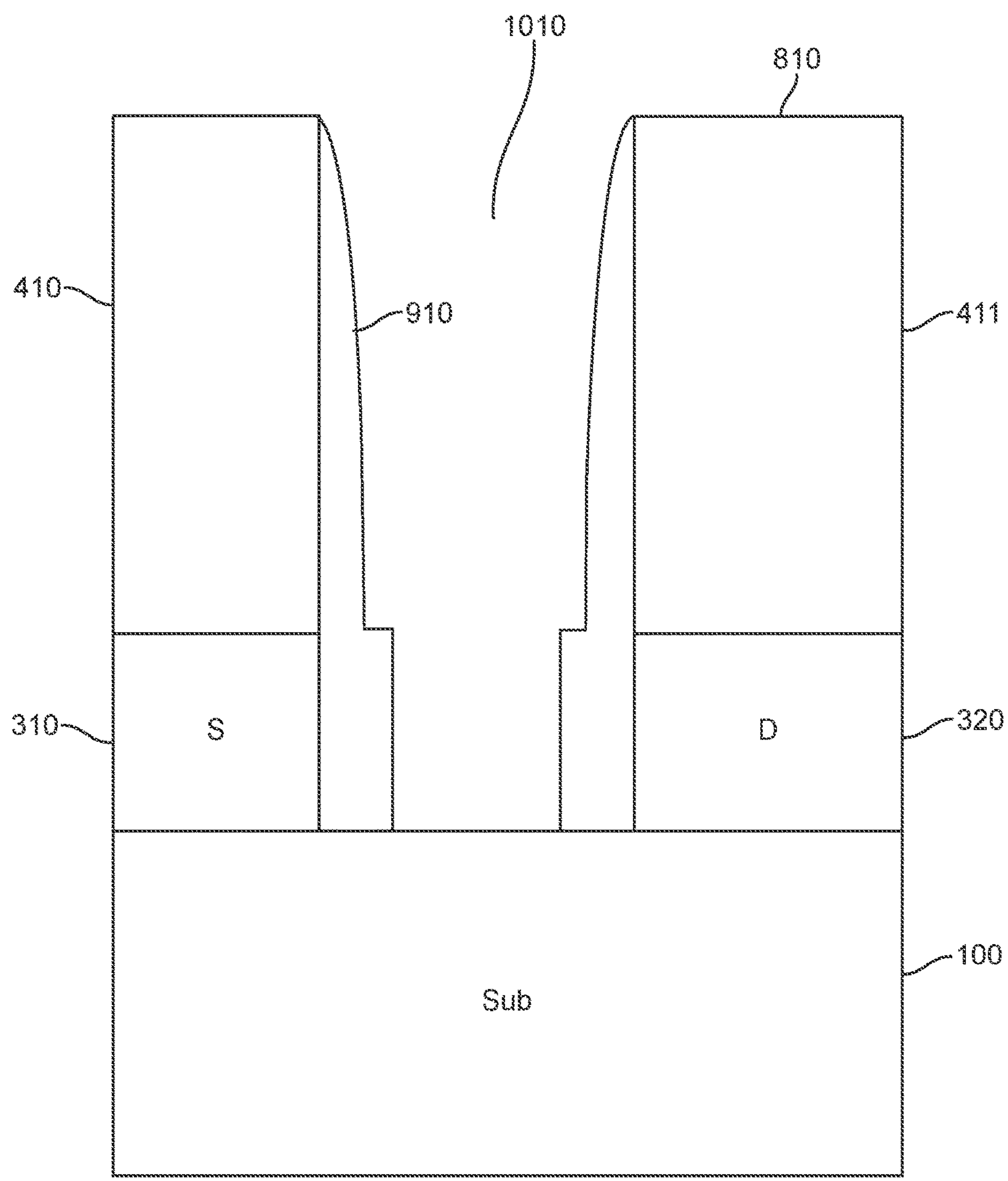
FIG. 10 is a cross-sectional view of the exemplary structure after performing dummy gate stack poly pull process, according to an embodiment.

FIG. 10 is a cross-sectional view of the exemplary structure after performing dummy gate stack poly pull process, according to an embodiment. In one embodiment, the remaining portion 520 from the dummy gate stack is pulled and removed from the structure leaving the recess 1010. The recess 1010 is wider at its top than its bottom and is ideal for work function metal (WFM) fill and multiple depositions that are performed later for creation of the RMG structure.

Figure 11:
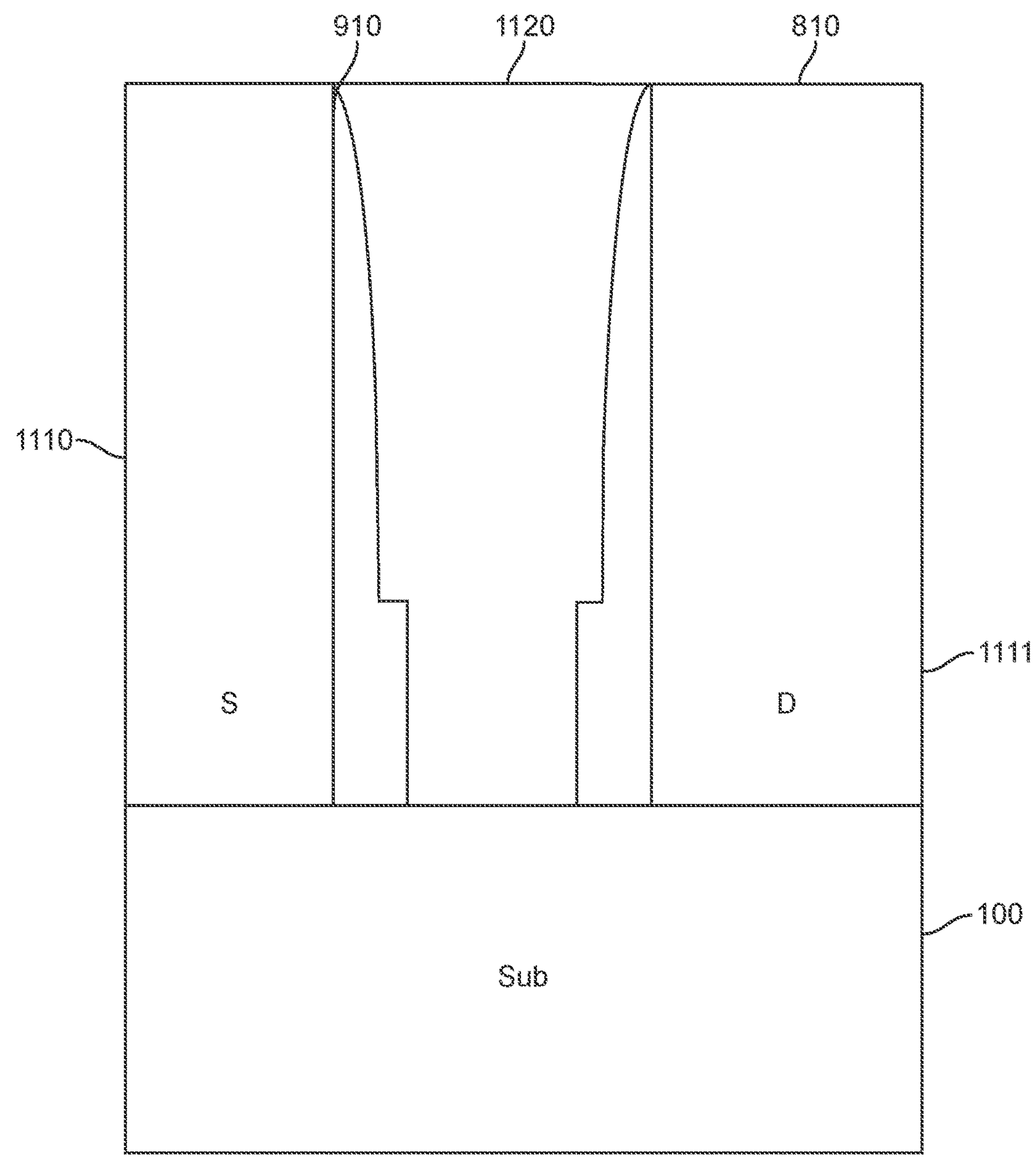
FIG. 11 is a cross-sectional view of the exemplary structure after performing multiple depositions for forming an RMG stack, according to an embodiment.

FIG. 11 is a cross-sectional view of the exemplary structure after performing multiple depositions for forming an RMG stack, according to an embodiment. In one embodiment, the RMG stack 1120 is formed after the low-k etching creating the remaining low-k material 910 from processes, such as high-k gate dielectric deposition, WFM (e.g., TiN, TaN, TaAlN, etc.) deposition, low resistance metal (e.g. Al, W, etc.) deposition, CMP stopping on ILD oxide of the oxide layers 1110 and 1111, etc. In one embodiment, the low-k remaining portion 910 forms the low-k spacers for the RMG structure. It is noted that the RMG materials are not depicted separately for simplicity, but should be understood by contemporary RMG formation processing.

In one embodiment, the gate dielectric of the RMG stack 1120 is composed of a high-k material having a dielectric constant greater than silicon oxide. Exemplary high-k materials include, but are not limited to, $HfO_2$, $ZrO_2$, $La_2O_3$, $Al_2O_3$, $TiO_2$, $SrTiO_3$, $LaAlO_3$, $Y_2O_3$, HfOxNy, $ZrO_x$ $La_2O_xN_y$, $Al_2$OxNy, TiOxNy, SrTiOxNy, LaAlOxNy, $Y_2$OxNy, SiON, SiNx, a silicate thereof, and an alloy thereof. Each value of x is independently from 0.5 to 3 and each value of y is independently from 0 to 2.

In one embodiment, the gate cavity formed with the multiple depositions, etc. to form the RMG stack 1120 may be filled with at least one conductive material, such as at least one metallic material and/or at least one doped semiconductor material. Examples of the conductive metal include, but are not limited to, Al, W, Cu, Pt, Ag, Au, Ru, Ir, Rh and Re, alloys of a conductive metal, e.g., Al—Cu, metal nitrides or carbides such as AN, TiN, TaN, TiC and TaC, silicides of a conductive metal, e.g., W silicide, and Pt silicide, and combinations thereof. The gate electrode of the RMG stack 1120 can be formed by depositing the conductive material utilizing a conventional deposition process such as, for example, atomic layer deposition (ALD), chemical vapor deposition (CVD), metalorganic chemical vapor deposition (MOCVD), molecular beam epitaxy (MBE), physical vapor deposition (PVD), sputtering, plating, evaporation, ion beam deposition, electron beam deposition, laser assisted deposition, and chemical solution deposition.

Figure 12:
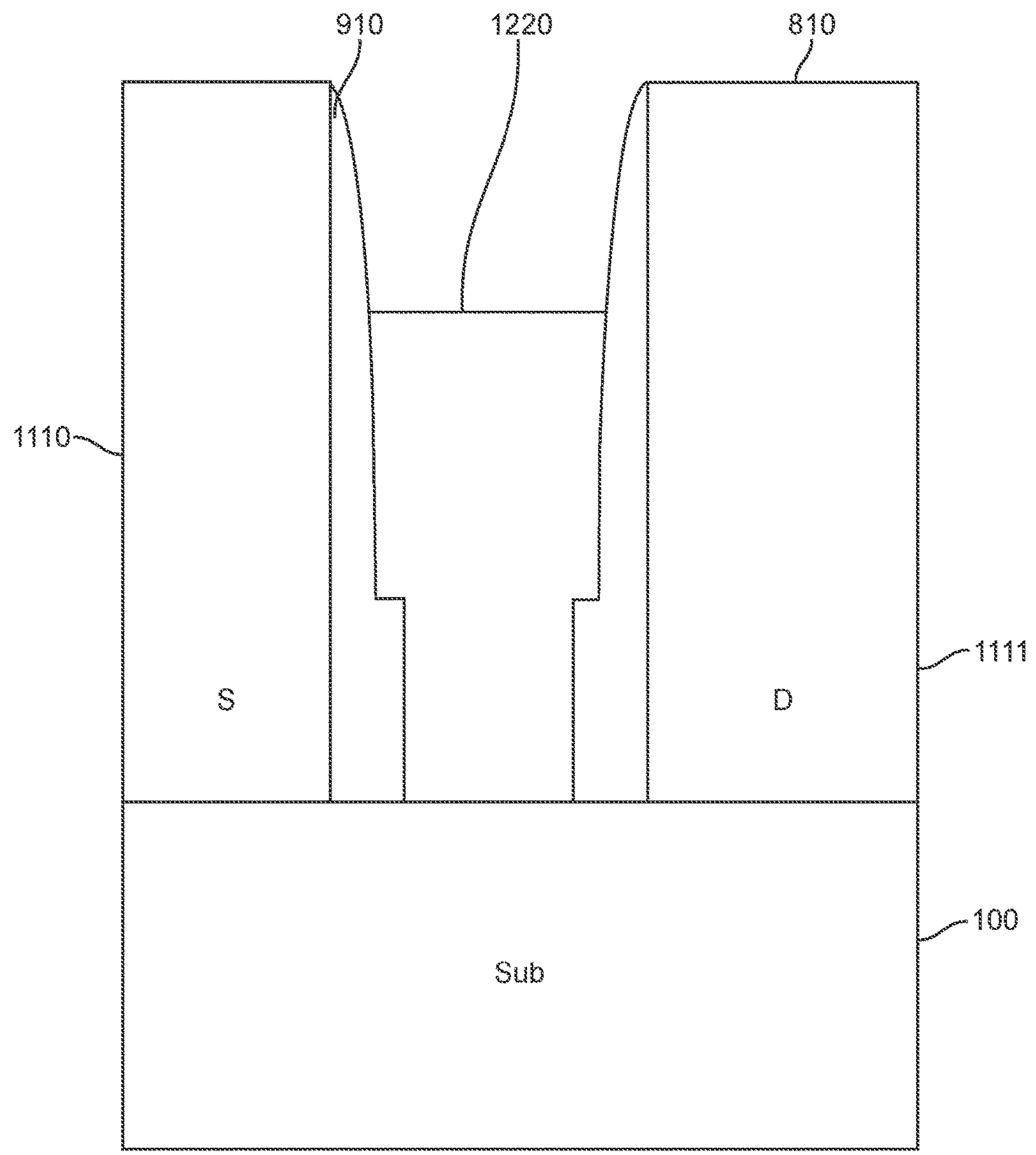
FIG. 12 is a cross-sectional view of the exemplary structure after recessing the RMG stack, according to an embodiment.

FIG. 12 is a cross-sectional view of the exemplary structure after recessing the RMG stack 1120, according to an embodiment. In one embodiment, the RMG stack 1120 is reduced to the remaining completed RMG stack 1220 by using a wet or dry etch on the metal material. In one embodiment, the etching removes a portion of the RMG stack 1120 to make room for a cap as follows.

Figure 13:
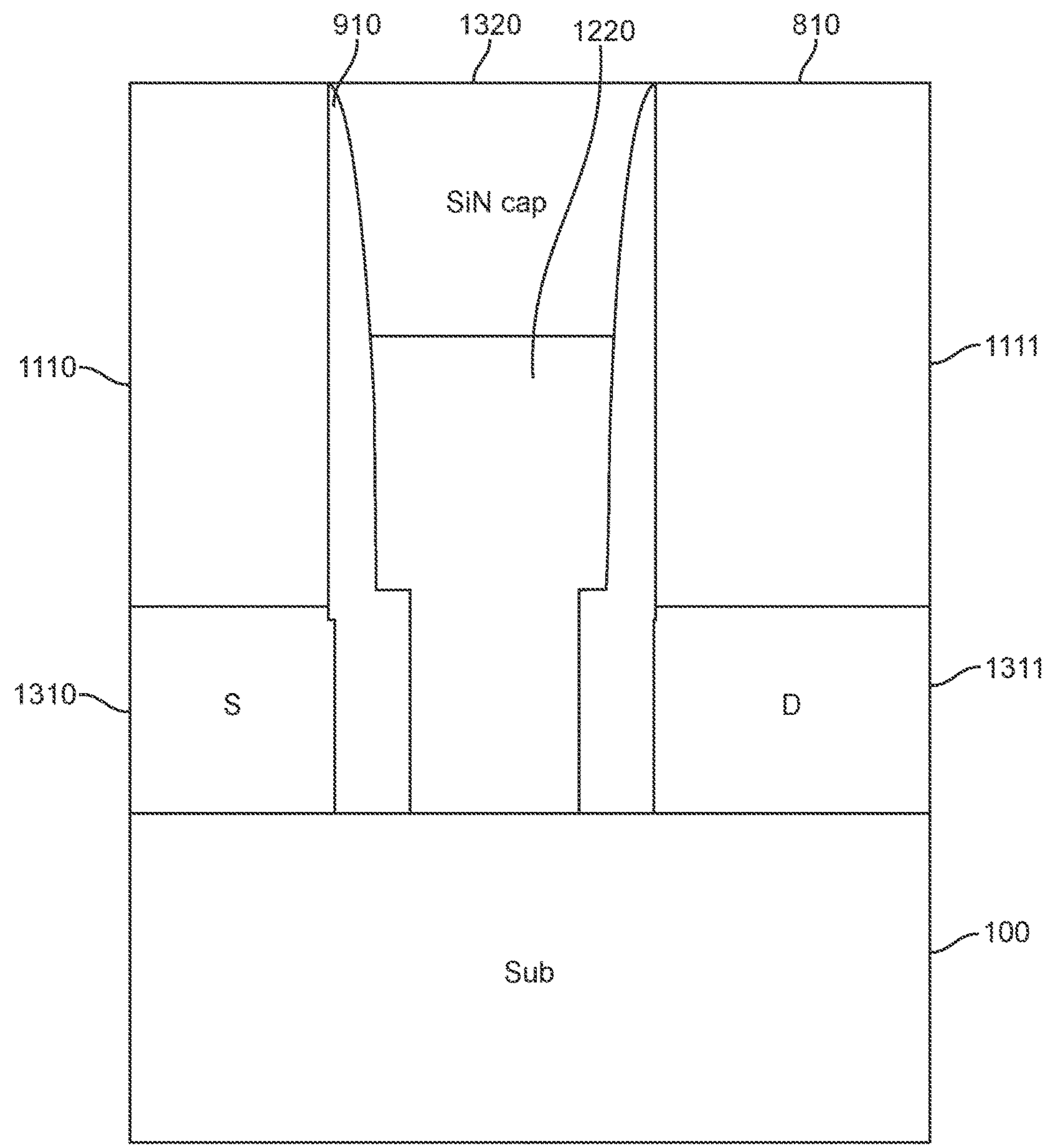
FIG. 13 is a cross-sectional view of an exemplary structure after depositing a nitride cap and performing CMP to stop on the oxide layer, according to an embodiment.

FIG. 13 is a cross-sectional view of an exemplary structure after depositing a nitride cap 1320 and performing CMP to stop on the oxide layers 1110 and 1111, according to an embodiment. In one embodiment, after the completed RMG stack 1220 formation, a nitride cap 1320 is deposited and then CMP is stopped on the oxide layers 1110 and 1111 within the vertically profiled low-k spacer material 910 that surrounds the nitride cap 1320 (e.g., silicon nitride, etc.). Also shown are the source junction 1310 and a drain junction 1320.

Figure 14:
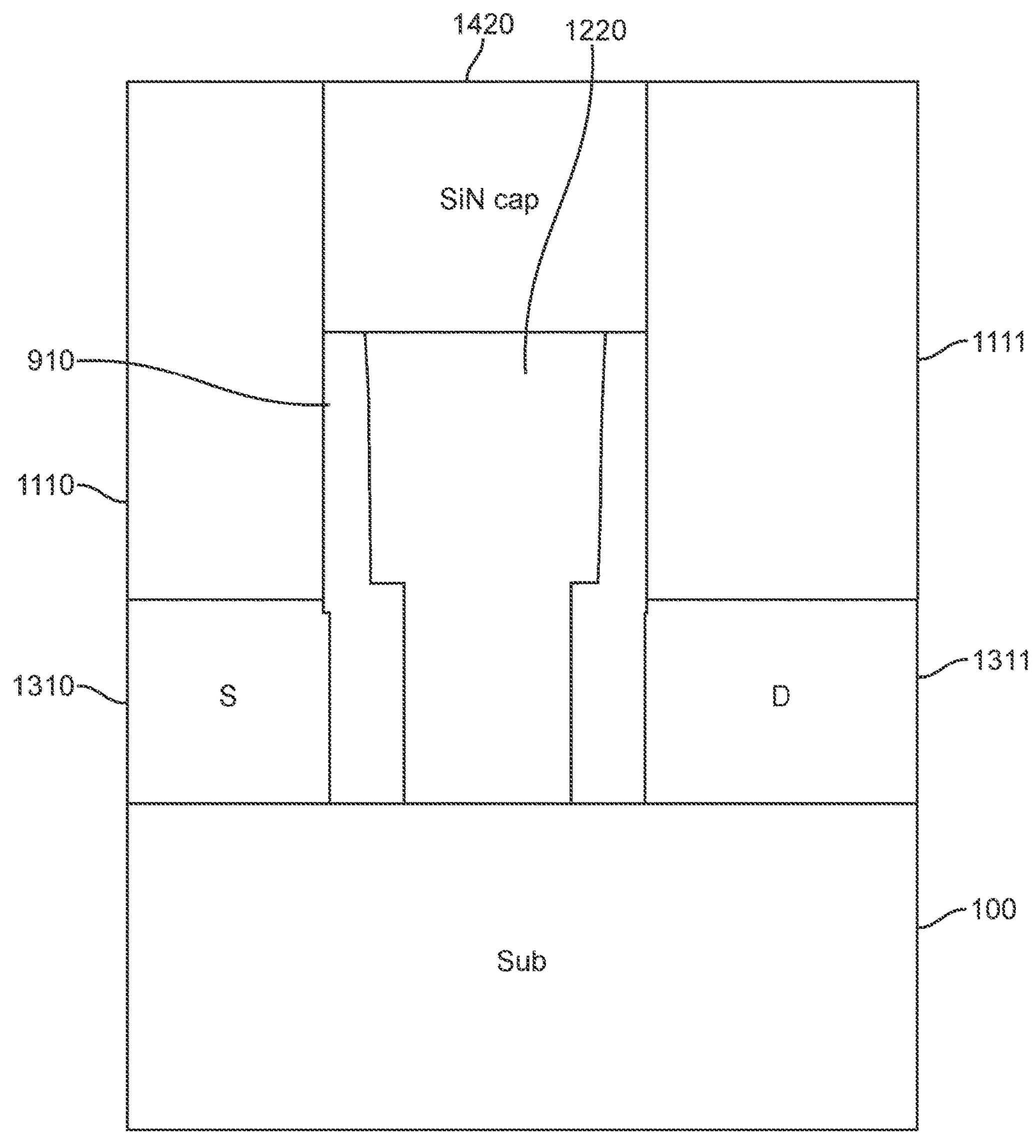
FIG. 14 is a cross-sectional view of another exemplary structure after etching the low-k spacers and depositing a nitride cap and performing CMP to stop on the oxide layer, according to an embodiment.

FIG. 14 is a cross-sectional view of another exemplary structure after etching the low-k spacer material 910 and depositing a nitride cap 1420 and performing CMP to stop on the oxide layers 1110 and 1111, according to an embodiment. In one embodiment, the low-k spacer material 910 is etched after the completed RMG stack 1220 is recessed. In one embodiment, the nitride cap 1420 (e.g., silicon nitride, etc.) completely covers the completed RMG stack 1220, which is robust for self-aligned contact formation.

Figure 15:
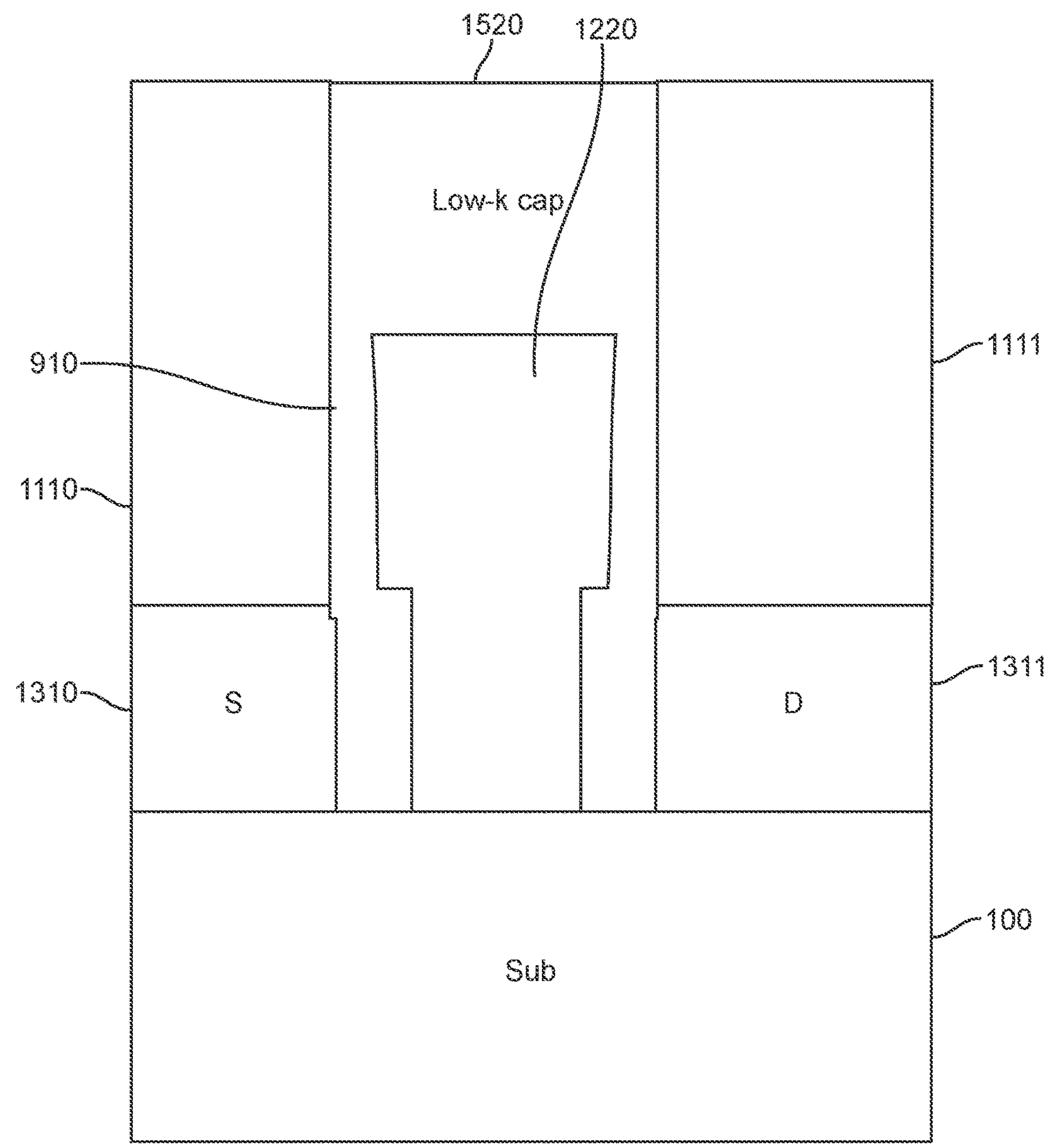
FIG. 15 is a cross-sectional view of yet another exemplary structure after depositing a low-k material cap, according to an embodiment.

FIG. 15 is a cross-sectional view of yet another exemplary structure after depositing and etching a low-k spacer material 910, according to an embodiment. In one embodiment, after the completed RMG stack 1220 is recessed, a low-k dielectric material is deposited on to the low-k spacer material 910 and used as a cap 1520 to lower the capacitance. In one embodiment, the low-k cap 1520 material may be the same or different than the low-k spacer 910 material.

Unlike conventional replacement spacer formation processes, one or more embodiments form the low-k spacer material 910 prior to forming the completed RMG stack 1220. Conventional processing exposes the RMG stack to the spacer replacement process steps, which is avoided by the processing of one or more embodiments. Removal of all the sacrificial layers entails dealing with a high aspect ratio for reactive ion etch (RIE)/etch issues, which is bypassed by the processing of one or more embodiments.

Figure 16:
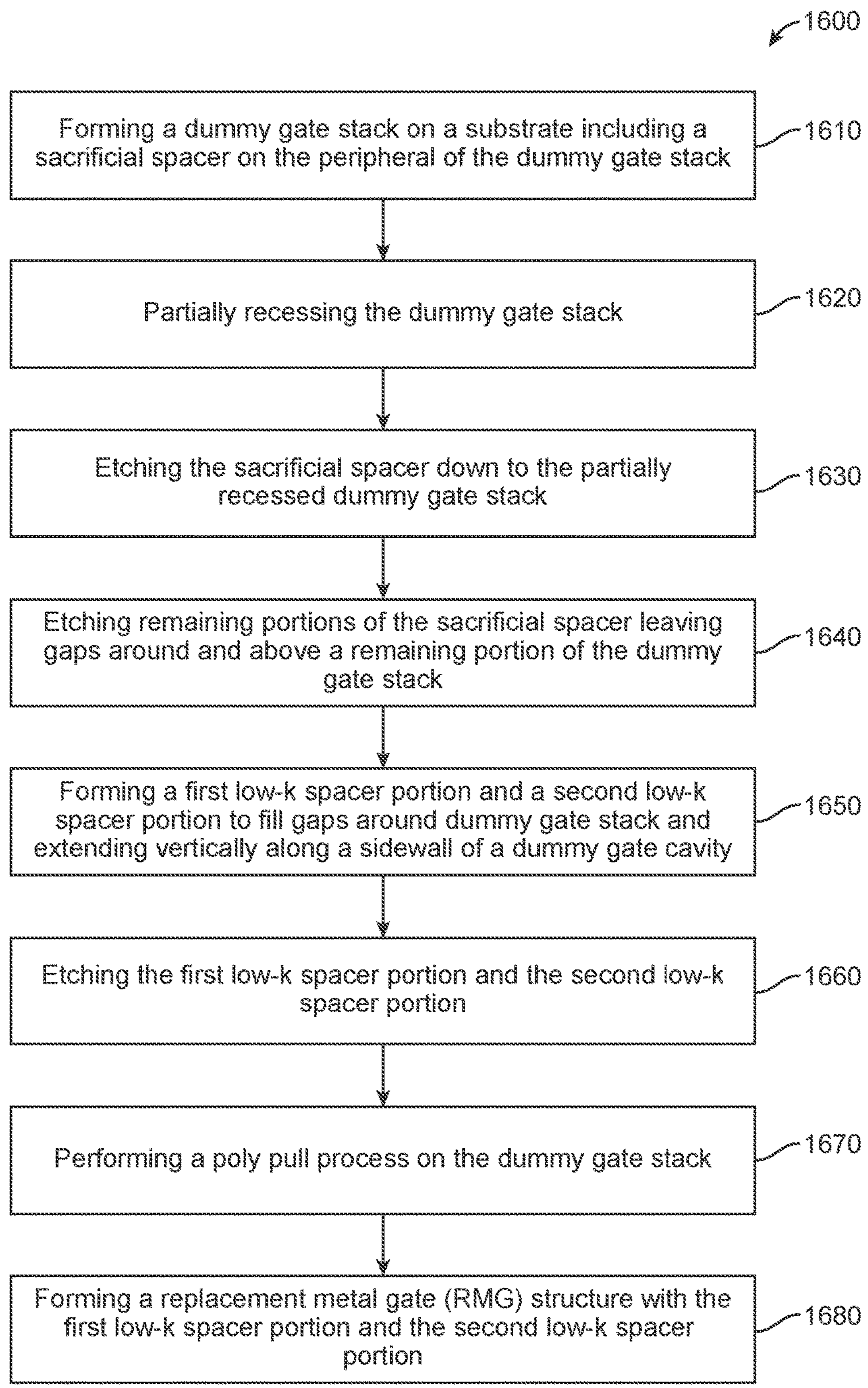
FIG. 16 illustrates a block diagram for a process for forming a semiconductor with low-k spacers formed prior to RMG stack formation, according to one embodiment.

FIG. 16 illustrates a block diagram for a process 1600 for forming a semiconductor structure, according to one embodiment. In one embodiment, in block 1610 a dummy gate stack is formed on a substrate (e.g., substrate 100, FIG. 1) including a sacrificial spacer material deposited (e.g., sacrificial spacer portions 210 and 211, FIG. 2) on the peripheral of the dummy gate stack. In block 1620 the dummy gate stack is partially recessed. In block 1630, the sacrificial spacer is etched down (resulting in remaining sacrificial spacer portions 610 and 611, FIG. 6) to the partially recessed dummy gate stack. In one embodiment, in block 1640 remaining portions of the sacrificial spacer is etched leaving gaps around and above a remaining portion of the dummy gate stack.

In one embodiment, in block 1650 a first low-k spacer portion and a second low-k spacer portion (e.g., the low-k material 810, FIG. 8) are formed to fill gaps around the remaining portions of the dummy gate stack and extending vertically along a sidewall of a dummy gate cavity. In one embodiment, in block 1660 the first low-k spacer portion and the second low-k spacer portion are etched. In block 1670 a poly pull process is performed on the remaining portions of the dummy gate stack. In one embodiment, in block 1680 an RMG structure (e.g., RMG stack 1120, FIG. 11, completed RMG stack 1220, FIG. 12) is formed with the first low-k spacer portion and the second low-k spacer portion (which are already formed prior to the RMG structure formation).

In one embodiment, process 1600 may provide that forming the dummy gate stack includes forming a source junction on the substrate adjacent the first dielectric spacer portion and a drain junction on the substrate adjacent the second dielectric spacer portion, and depositing an oxide layer over the source junction and the drain junction. In one embodiment, process 1600 may include forming a silicon nitride cap layer over the RMG structure and between the first low-k spacer portion and the second low-k spacer portion, and performing CMP to reduce a height of the silicon nitride cap layer down to the oxide layer.

In one embodiment, process 1600 may include forming a silicon nitride cap layer over the RMG structure, and performing CMP to reduce a height of the silicon nitride cap layer to the oxide layer (where the silicon nitride cap layer completely covers the RMG structure). In one embodiment, process 1600 may further include forming a low-k cap layer over the RMG structure and adjacent to the first low-k spacer portion and the second low-k spacer portion, where a height of the low-k cap layer is reduced to the oxide layer.

Having described preferred embodiments of a method and device for low-k spacer for RMG FET formation (which are intended to be illustrative and not limiting), it is noted that modifications and variations can be made by persons skilled in the art in light of the above teachings. It is therefore to be understood that changes may be made in the particular embodiments disclosed which are within the scope of the embodiments as outlined by the appended claims.

References in the claims to an element in the singular is not intended to mean "one and only" unless explicitly so stated, but rather "one or more." All structural and functional equivalents to the elements of the above-described exemplary embodiment that are currently known or later come to be known to those of ordinary skill in the art are intended to be encompassed by the present claims. No claim element herein is to be construed under the provisions of 35 U.S.C. section 112, sixth paragraph, unless the element is expressly recited using the phrase "means for" or "step for."

The terminology used herein is for the purpose of describing particular embodiments only and is not intended to be limiting of the embodiments. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, materials, and/or components, but do not preclude the presence or addition of one or more other features, steps, operations, elements, materials, components, and/or groups thereof.

The corresponding structures, materials, acts, and equivalents of all means or step plus function elements in the claims below are intended to include any structure, material, or act for performing the function in combination with other claimed elements as specifically claimed. The description of the embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments. The embodiments were chosen and described in order to best explain the principles of the embodiments and the practical application, and to enable others of ordinary skill in the art to understand the embodiments with various modifications as are suited to the particular use contemplated.

What is claimed is:

1. A method comprising:

forming a dummy gate stack on a substrate including a sacrificial spacer on a peripheral of the dummy gate stack;

etching down the sacrificial spacer using an over etch process, wherein the over etch process comprises:

partially recessing the dummy gate stack;

etching the sacrificial spacer down to the partially recessed dummy gate stack; and etching remaining portions of the sacrificial spacer to form a dummy gate cavity that includes gaps around and above the partially recessed dummy gate stack;

filling a portion of the gaps with low-k spacer material that extends vertically along a sidewall of the dummy gate cavity; and etching the low-k spacer material on the sidewall of the dummy gate cavity and below the partially recessed dummy gate stack to form a first low-k spacer portion and a second low-k spacer portion disposed above the first low-k spacer portion, wherein the first low-k spacer portion has a corresponding width that is constant as the first low-k spacer portion extends vertically along the sidewall of the dummy gate cavity, and the second low-k spacer portion has a corresponding width that tapers towards the sidewall of the dummy gate cavity as the second low-k spacer portion extends vertically along the sidewall of the dummy gate cavity.

2. The method of claim 1, further comprising performing a poly pull process on the partially recessed dummy gate stack;

forming a replacement metal gate (RMG) structure with the first low-k spacer portion and the second low-k spacer portion; and forming a low-k cap layer over the RMG structure.

3. The method of claim 2, wherein a height of the low-k cap layer is reduced to an oxide layer of the substrate.

4. The method of claim 2, wherein the first low-k spacer portion and the second low-k spacer portion each are comprised of a material with a dielectric constant lower than silicon nitride.

5. The method of claim 2, wherein the low-k cap layer is coupled to the second low-k spacer portion.

6. The method of claim 2, wherein the low-k cap layer comprises a material with a dielectric constant lower than silicon nitride.

7. The method of claim 2, wherein the low-k cap layer comprises a same material as the first low-k spacer portion and the second low-k spacer portion.

* * * * *